United States Patent [19]
Ishikawa

[11] Patent Number: 6,125,076
[45] Date of Patent: Sep. 26, 2000

[54] WORD LINE CONTROL CIRCUIT

[75] Inventor: Toru Ishikawa, Tokyo, Japan

[73] Assignee: NEC Corporation, Tokyo, Japan

[21] Appl. No.: 09/301,861

[22] Filed: Apr. 29, 1999

[30] Foreign Application Priority Data

Apr. 30, 1998 [JP] Japan .................................. 10-120525

[51] Int. Cl.[7] .................................................. G11C 8/00
[52] U.S. Cl. ................................ 365/230.06; 365/230.03; 365/230.08
[58] Field of Search ......................... 365/230.06, 230.03, 365/230.08

[56] References Cited

U.S. PATENT DOCUMENTS

| | | | |
|---|---|---|---|
| 5,848,006 | 12/1998 | Nagata | 365/230.06 |
| 5,910,927 | 6/1999 | Hamamoto et al. | 365/230.03 |
| 5,970,016 | 10/1999 | Ohsawa | 365/230.03 |

FOREIGN PATENT DOCUMENTS

| | | |
|---|---|---|
| 409198900 | 7/1997 | Japan . |
| 9-231755 | 9/1997 | Japan . |

OTHER PUBLICATIONS

"Advanced Electronics I–9," *Super LSI Memory*, Baifukan, First Edition Published Nov. 5, 1994, Japan.

*Primary Examiner*—David Nelms
*Assistant Examiner*—Connie C. Yoha
*Attorney, Agent, or Firm*—Darryl G. Walker

[57] ABSTRACT

According to one embodiment, a word line control circuit (100) includes certain sub-array word lines (SWL-00 to SWL-03) coupled to one bank (BANK0)of memory cells and other sub-array word lines (SWL-10 to SWL-13) coupled to another bank (BANK1) of memory cells. Complementary main word lines (MWL and /MWL) are provided that can select groups of sub-array word lines in both banks when activated. Latch circuits (104-A0 to 104-B1) are provided for latching main word lines values. Such an arrangement allows a complementary main word line values to be latched for a first bank (BANK0), thereby selecting a group of sub-array word lines (SWL-00 to SWL-03) in the first bank (BANK0). The complementary main word line (MWL and /MWL) can then be activated again. The second complementary main word line values can then latched for a second bank (BANK1), thereby selecting a group of sub-array word lines (SWL-10 to SWL-13) in the second bank (BANK0). Such an arrangement allows a main word line to be common to both banks, while still allowing individual selection of different sub-array word lines in different banks.

20 Claims, 7 Drawing Sheets

PRIOR ART

WORD LINE CONTROL CIRCUIT

TECHNICAL FIELD

The present invention relates to word line control circuits, and more particularly to word line control circuits for random access memories (RAMs), such as dynamic RAMs (DRAMs) or static RAMs (SRAMs).

BACKGROUND OF THE INVENTION

Recently, memory devices have been developed that include bank structures. Bank structures can logically divide a memory device into different portions that can be accessed when selected. A bank typically includes one or more memory cell arrays that can be accessed in a row-wise direction by a row decoder. One drawback associated with memory devices having bank structures is that in order to access banks separately, a row decoder is associated with each bank. Row decoders, particularly for large capacity memory devices, can consume considerable area. Increases in device area may result in more expensive manufacturing costs.

Figure 5:
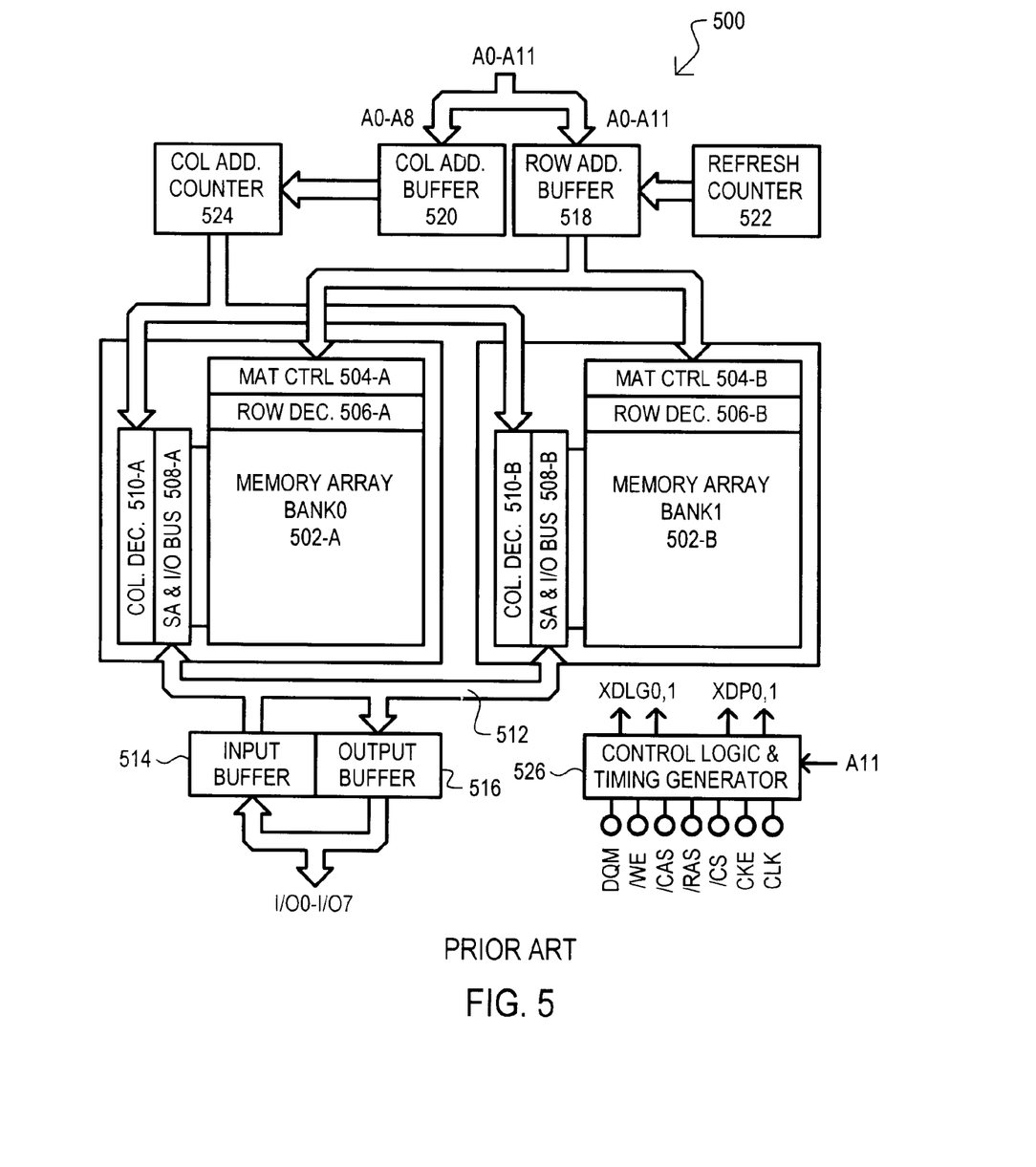
FIG. 5 is a block diagram of a conventional synchronous DRAM.

To better understand the drawbacks associated with conventional bank structure memories, an example of a conventional memory device is set forth in FIG. 5. FIG. 5 illustrates a synchronous dynamic random access memory (SDRAM) having multiple banks, where each bank is controlled by a corresponding row decoder. The approach set forth in FIG. 5 is disclosed in Japanese Patent Application Laid-open No. Hei 9-231755. The SDRAM of FIG. 5 can be formed on a semiconductor substrate, such as a monocrystalline silicon substrate, using known semiconductor integrated circuit manufacturing techniques.

Referring now to FIG. 5, the conventional SDRAM is designated by the general reference character 500, and is shown to include a memory array 502-A that includes a memory bank 0 (shown as "BANK 0"), and a memory array 502-B that includes a memory bank 1 (shown as "BANK 1"). Each memory array (502-A and 502-B) includes DRAM memory cells arranged in a matrix. Each memory cell includes a select terminal and a data input/output (I/O) terminal. Memory cells within the same row have select terminals coupled to a common word line (not shown). Memory cells within the same column have data I/O terminals coupled to a complementary data line (also not shown).

A word line of memory array 502-A can be driven to a select level by a mat control circuit 504-A and row decoder 506-A. The mat control circuit 504-A and row decoder 506-A can decode a row address, and in conjunction with a row timing signal, drive a selected word line to a select level.

The complementary data lines of memory array 502-A are coupled to a sense amplifier and column select circuit 508-A. Sense amplifiers within the sense amplifier and column select circuit 508-A can detect fine potential differences on respective complementary data lines by amplifying such potential differences. In this manner, data can be read from selected memory cells. The sense amplifier and column select circuit 508-A includes switch circuits for selecting predetermined complementary data lines, and coupling them to a complementary common data I/O bus 512. The switch circuits selects predetermined complementary data lines according to a decoded column address. Column addresses for memory array 502-A are decoded by a column decoder 510-A.

In a similar arrangement to memory array 502-A, the memory array 502-B is provided with a mat control circuit 504-B, a row decoder 506-B, a sense amplifier and column select circuit 508-B, and a column decoder 510-B.

The complementary common data I/O bus 512 is shown to be coupled to both sense amplifier and column select circuits (508-A and 508-B). The complementary common data I/O bus 512 is further connected to the output of an input buffer 514 and to the input of an output buffer 516. The input buffer 514 receives input values from data I/O terminals I/O0–I/O7. Similarly, the output buffer 516 can place output values on the data I/O terminals I/O0–I/O7.

The SDRAM 500 of FIG. 5 receives address values in a multiplexed fashion. Initially a row address can be applied via address input terminals A0 to A11. The row address is latched in a row address buffer 518. Subsequently, a column address can be applied via address input terminals A0 to A11 and latched in a column address buffer 520. In the arrangement of FIG. 5, the row address buffer 518 holds a latched row address for one clock cycle of a master clock CLK. This is in contrast to other conventional approaches in which a row address is latched for an entire memory cycle. In contrast, the column address buffer 520 of FIG. 5 latches a column address during an entire memory cycle.

As shown in FIG. 5, the row address buffer 518 can also receive a refresh address from a refresh counter 522 in a refresh mode of operation. The column address buffer 520 provides column address values to a column address counter 524. The column address counter 524 provides select data to the column decoders (510-A and 510-B).

The SDRAM 500 further sets forth a controller 526. The controller is supplied with external control signals, such as a master clock signal CLK, a clock enable signal CKE, a chip select signal /CS, a column address strobe signal /CAS, a row address strobe signal /RAS, a write enable signal /WE, and data I/O mask control signal DQM. The controller 526 also receives control data by way of address terminal A11. It is understood that those signals that are preceded by the symbol "/" are active when at a logic low.

In response to the various input values (CLK, CKE, /CS, /CAS, /RAS, /WE, DQM, and A11) the controller 526 generates a number of internal timing signals, shown as XDGL0, XDGL1, XDP0, XDPO1, etc. The internal timing signals control the operation mode of the SDRAM 500 and the operation of the various circuit blocks set forth in FIG. 5. Accordingly, the controller 526 includes control logic and a mode register for generating the appropriate internal timing signals.

It is noted that the CLK signal is the master clock for the SDRAM 500. As a result, the other external input signals are significant on the rising edge of the CLK signal. It is further noted that the chip select signal /CS initiates the start of a command input cycle by transitioning to a low logic level.

As described above, in the conventional example of FIG. 5 each of the banks (BANK0 and BANK1) is provided with a row decoder (506-A and 506-B) and a column decoder (510-A and 510-B) in order to allow each bank (BANK0 and BANK1) to be accessed individually in a read or write operation.

Figure 6:
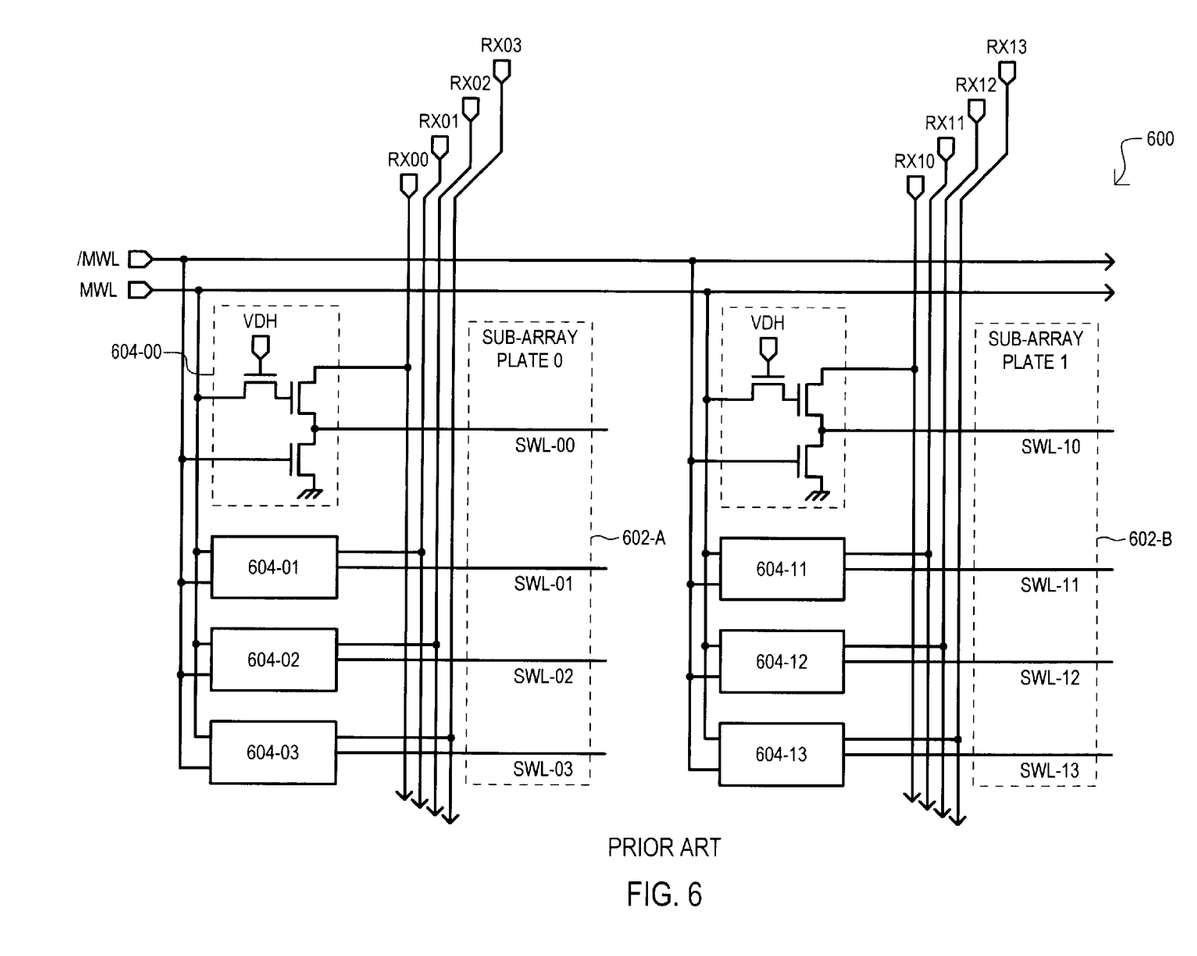
FIG. 6 is a block diagram illustrating a DRAM structure having a main word line and sub-array plates.

A conventional DRAM having a multi-bank structure that includes sub-array plates will now be described with reference to FIG. 6. Referring now to FIG. 6, a portion of a DRAM structure having sub-array plates is designated by the general reference character 600. The DRAM structure 600 includes sub-array plates 602-A and 602-B having memory cells that are accessed by way of complementary main word lines MWL and /MWL. The complementary main word lines (MWL and /MWL) are coupled to memory cells within the sub-array plates (602-A and 602-B) in the row-wise direction through a number of sub-array word lines (SWL-00 to SWL-13). This arrangement results in a hierarchical structure in which eight rows of sub-array word lines are controlled by a pair of complementary main word lines (MWL and /MWL).

Sub-array word lines drivers are shown as 604-00 to 604-13, and drive sub-array word lines SWL-00 to SWL-13, respectively. Each sub-array word line driver (604-00 to 604-13) receives the complementary main word line signals (WL and /WL), as well as one of eight word line supply signals RX00 to RX13. In addition, each sub-array word line driver (604-00 to 604-13) also receives a pass voltage VDH.

The arrangement of FIG. 6 thus includes a row decoder and main word line driver to generate the complementary main word line signals (MWL and /MWL) for eight rows of memory cells. In addition, drivers may be provided to generate the word line supply signals (RX00 to RX13) according to certain address values.

In the structure of FIG. 6, to access a row of memory cells, the complementary main word line pair and one word line supply signal are selected. In this arrangement, the selected complementary main word line pair will couple the selected word line supply signal to a sub-array word line.

Figure 7:
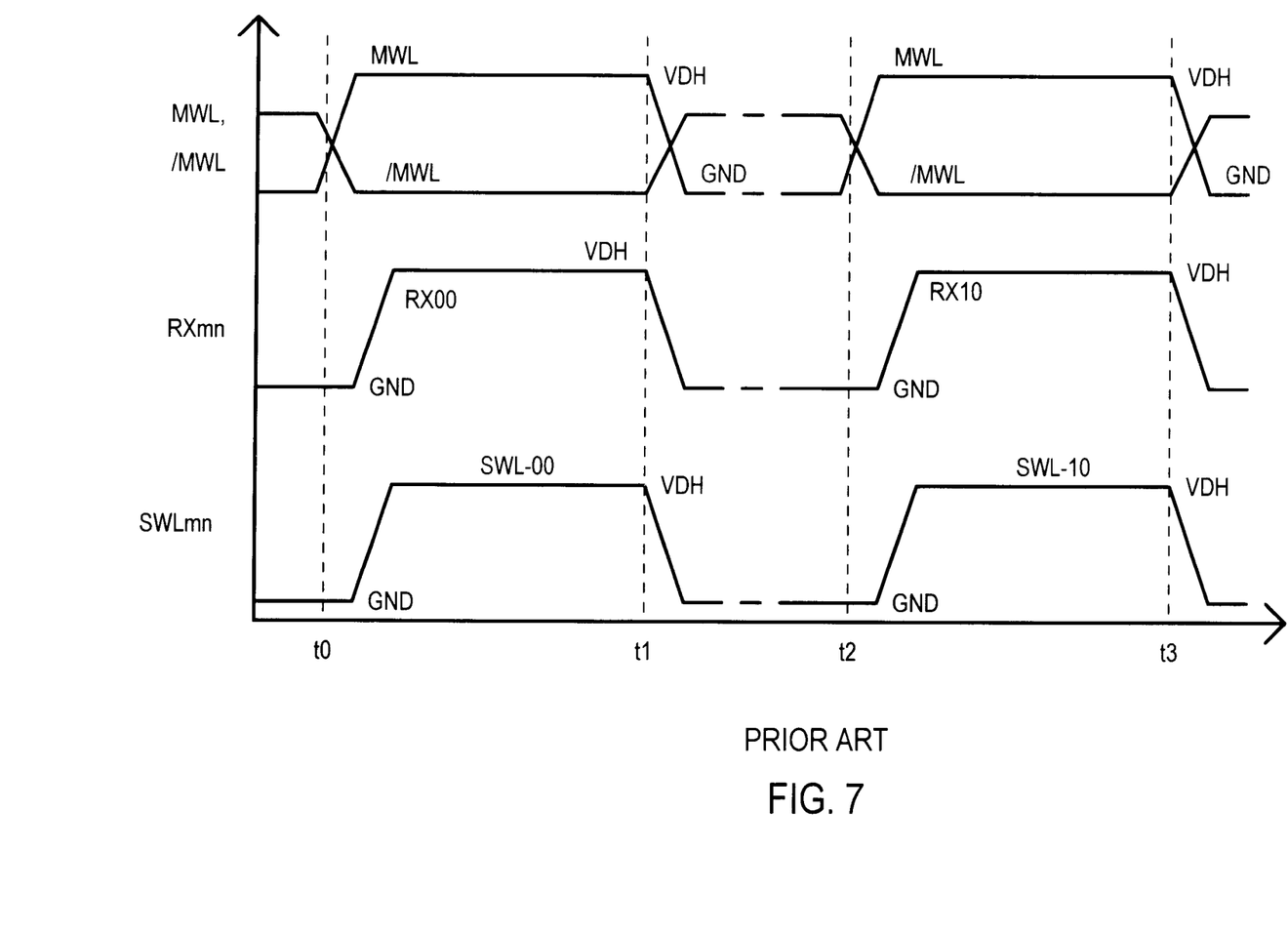
FIG. 7 is a timing diagram illustrating the operation of the DRAM structure of FIG. 6.

The operation of the structure set forth in FIG. 6 will now be described in conjunction with a timing diagram set forth in FIG. 7. The timing diagram illustrates various waveforms for signals set forth in FIG. 6. Waveform "MWL, /MWL" illustrates the response of the complementary main word lines (MWL and /MWL). Waveform RXmn illustrates the response of the RX00 to RX13 signals. Waveform SWLmn illustrates the response of sub-array word lines SWL-00 to SWL-13. FIG. 7 illustrates the selection of sub-array word line SWL-00 followed by the selection of sub-array word line SWL-10. Also included in FIG. 7 are various logic level values, including a low supply value GND, a high supply value VDD and higher supply value VDH.

At time t0, the MWL signal transitions to the VDH level, while the complementary /MWL signal transitions to the low level. Shortly thereafter, the RX00 signal transitions to the VDH level. As a result, the sub-array word line SWL-00 is selected and driven to a high VDH level. At time t1 the MWL signal returns low while the /MWL signal rises to the VDD level. At about the same time, the RX00 signal returns to the GND level. As a result, the sub-array word line SWL-00 is de-selected, and returns to the GND level.

At time t2, the MWL signal transitions once again to the VDH level, while the complementary /MWL signal transitions to the low level once again. Shortly thereafter, the RX10 signal transitions to the VDH level. As a result, the sub-array word line SWL-10 is selected and driven to a high VDH level. At time t3 the MWL signal returns low while the /MWL signal rises to the VDD level. At about the same time, the RX10 signal returns to the GND level. As a result, the sub-array word line SWL-10 is de-selected, and returns to the GND level.

In this way, because a sub-array plate is selected for each bank, a circuit for controlling the various sub-array word line drivers (604-00 to 604-13) may be required for each bank. The same general circuit for sub-array word lines is disclosed in "Advanced Electronics I-9", "Super LSI memory", p.160, issued by Baifukan.

A drawback to conventional multi-bank memory device approaches is the amount of area that may be consumed by providing a row decoder for each bank. Increases in bank size or the overall number of banks may result in corresponding increases in circuit area for row decoders.

Another drawback to conventional approaches having sub-array plates, such as that set forth in FIG. 6, is the limited control of sub-array word lines. Because the complementary main word lines (MWL and /MWL) are common to both sub-array plates (602-A and 602-B), sub-array word lines in different sub-array plates cannot be controlled individually. Consequently, if it is desired to have separately controllable sub-array plates, an additional complementary main word line pair may be needed for each sub-array plate. Such an approach may not be possible due to allowable conductive line pitch and/or may require additional conductive layers. This can make the layout of the device more complex and/or the fabrication of the device more expensive.

Another aspect of integrated circuits is the number of conductive lines required to provide necessary signals to the various portions of the device. In particular, the "pitch" (or minimum spacing) required for conductive lines may be of particular concern for memory devices. Memory devices typically include memory cells of very small size. Accordingly, the word lines and/or bit lines connected to the memory cells usually have as small a pitch as is practicable. Minimum pitch requirements can also be of concern for higher levels of metallization. For example, in the circuit of FIG. 6, it is important not only for the sub-array word lines to have a small pitch, but also for the main word lines to have a small pitch.

Reducing the number of conductive lines in a memory device can also be desirable in that it may result in more efficient routing of signals.

SUMMARY OF THE INVENTION

According to one or more of the embodiments, a word line control system can control a number of sub-array word lines. The word line control circuit includes a latch that receives values from a main word line. The latch provides latched values to sub-word line drivers.

According to another aspect of the disclosed embodiments, a memory device includes number of different sub-array plates that are accessed by sub-array word lines. Latch circuits are provided for each sub-array plate for latching a main word line value, and thereby selecting the sub-array plate.

According to another aspect of the disclosed embodiments, a word line control system includes latches that store main word line values that select a group of sub-array word lines. The latches latch main word line data in response to a bank activation signal.

According to another aspect of the disclosed embodiments, a latch for selecting a group of sub-array word lines includes a dynamic latch.

According to another aspect of the disclosed embodiments, a latch for selecting a group of sub-array word lines includes a static latch.

DETAILED DESCRIPTION OF THE EMBODIMENTS

Various embodiments will now be described in conjunction with a number of figures and timing diagrams. The embodiments set forth illustrate word line driver circuits that may be used in a random access memory (RAM) having multiple banks and/or multiple sub-array plates.

Figure 1A:
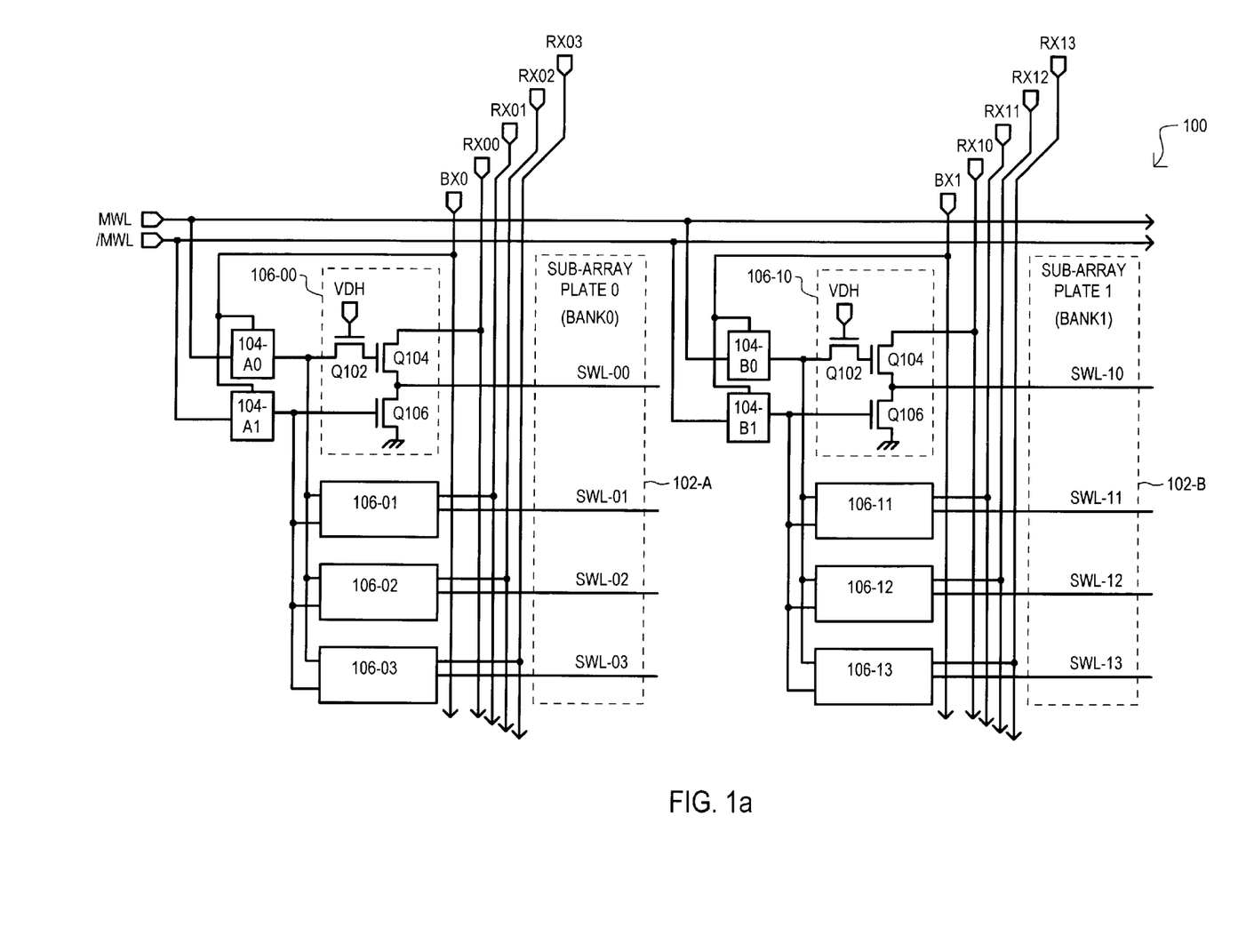
FIG. 1a is a circuit diagram showing a word line selection circuit according to one embodiment.

Referring now to FIG. 1a, a hierarchical word line control circuit for a RAM is designated by the general reference character 100. The first embodiment 100 can include a number of sub-array plates. Two particular sub-array plates are shown as 102-A and 102-B. In the particular arrangement of FIG. 1a, the sub-array plates 102-A and 102-B can form portions of different banks. As just one example, sub-array plate 102-A can belong to a BANK0, while sub-array plate 102-B can belong to a BANK1.

Sub-array plate 102-A can include four sub-array word lines SWL-00 to SWL-03. The four sub-array word lines (SWL-00 to SWL-03) can be selected by a complementary main word line pair MWL and /MWL. One of the four sub-array word lines (SWL-00 to SWL-03) can then be selected by activating one of four word line supply signals RX00 to RX03.

The word line select circuit 100 can be conceptualized as including a "sub-word structure" in that a main word line (MWL or /MWL) can select a group of sub-array word lines (SWL-00 to SWL-03). One of the sub-array word lines from the selected group can then be selected and thereby activated.

In a conventional approach, such as that set forth in FIG. 6, a complementary main word line pair (MWL and /MWL) is applied directly to the all of the sub-array drivers (604-00 to 604-13). In contrast, in the embodiment of FIG. 1a, latch circuits 104-A0, 104-A1, 104-B0 and 104-B1 are provided that can latch the state of a main word line (MWL and /MWL). The latched value can then be used to select a group of sub-array drivers (106-00 to 106-13).

As noted above, sub-array plates 102-A and 102-B can correspond to a BANK0 and BANK1. In the particular arrangement of FIG. 1a, a bank (BANK0 and BANK1) can be selected for access by a corresponding bank select signal BX0 or BX1. In the first embodiment 100, the BX0 signal, which can select BANK0, can also be used to latch main word line values into latches 104-A0 and 104-A1. Latches 104-A0 and 104-A1 can provide select signals for sub-array drivers 106-00 to 106-03 of BANK0. In a similar fashion, the BX1 signal, which can select BANK1, can be used to latch main word line values into latches 104-B0 and 104-B1. Latches 104-B0 and 104-B1 can provide select signals for sub-array drivers 106-10 to 106-13 of BANK1.

Figure 1B:
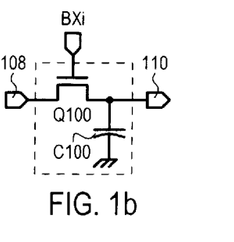
FIGS. 1b and 1c are schematic diagrams of latches that may be employed according to one embodiment.

A latch circuit, such as those set forth as 104-A0 to 104-B1, can take a variety of forms. Two the various possible implementations are set forth in FIGS. 1b and 1c. FIG. 1b illustrates a "dynamic" latch. A dynamic latch can include a charge storing element that stores a particular logic level. It is dynamic in that the certain logic values may decay over time, and eventually lose their stored logic values.

The particular dynamic latch circuit of FIG. 1b is shown to include a capacitor C100 that can store charge. In addition, a switching device Q100 is provided for coupling the storage device C100 to a main word line. The switching device of FIG. 1b is an n-channel insulated gate field effect transistor Q100. Such a latch may be advantageously implemented in a dynamic RAM as the manufacturing process may already be capable of forming reliable capacitor structures. The dynamic latch of FIG. 1b includes a latch input 108 that can receive an input main word line value, and a latch output 110 that can provide a latched value to other word line driver circuits (such as sub-array drivers 106-00 to 106-03 and 106-10 to 106-13). Transistor Q100 includes a gate that can receive a block select signal (such as BX0 or BX1). When the block signal is active, a word line value can charge or discharge capacitor C100, thereby storing the logic value. When the block signal is inactive, the logic value will be dynamically stored by capacitor C100. It is noted that in the case of an n-channel transistor Q100, the BX0 signal may be a supply voltage that is greater than a high logic voltage. Such an arrangement can reduce or eliminate a voltage threshold that can be introduced if the latched value is a high logic value. The dynamic latch also provides a compact structure for implementation.

Figure 1C:
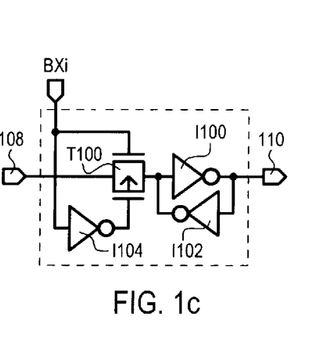

In contrast to the dynamic latch, the static latch of FIG. 1c will not lose a stored logic value over time. The particular static latch of FIG. 1c includes a complementary metal oxide semiconductor (CMOS) transfer gate T100 that includes an n-channel IGFET in parallel with a p-channel IGFET. The input of gate T100 can receive a main word line value. The output of gate T100 is applied to cross coupled inverters I100 and I102. The n-channel IGFET of gate T100 can receive a bank select signal (such as BX0 or BX1). The p-channel IGFET of gate T100 can receive the same bank select signal by way of an inverter I104. The static latch of FIG. 1c also includes a latch input 108 coupled to the input of gate T100 and a latch output 110 coupled to the cross-coupled inverters (I100 and I102). In this arrangement, when the applied bank select signal is active (high in the particular arrangement), a main word line value will be passed through gate T100 and latched in the inverters I100 and I102. Once the bank select signal returns to an inactive state, the main word line value can remain latched by inverters I100 and I102. The static latch of FIG. 1c can provide reliable latching of a main word line value, and by including a CMOS transfer gate, does not require a high supply voltage (like VH) to eliminate threshold voltage drops.

It is understood that the dynamic latch of FIG. 1b can also be considered a "non-inverting" latch in that its output logic value generally follows its input logic value. Similarly, the static latch of FIG. 1c can also be considered an "inverting" latch in that the output provided by the latch is the inverse of an input value. Of course, it is understood that an inverting device (such as an inverter) can be coupled to the input or output of the disclosed latches to thereby change an inverting latch to a non-inverting latch or vice versa.

It is further noted that in the event one latch of a latch pair (such as latch 104-A0 or 104-B0) is a non-inverting latch, and the other latch of the latch pair (such as latch 104-A1 or 104-B1) is an inverting latch, only one main word line may be required.

It follows from the above discussion that two inverting latches or two non-inverting latches could be employed for a device having a single main word line arrangement, while one inverting and one non-inverting latch could be employed for a device having a complementary word line pair.

Sub-array word line drivers 106-00 and 106-10 are shown to include a transfer device Q102, a driver device Q104, and a de-select device Q106. The transfer device Q102 applies a latched value from a latch (such as 104-A0 or 104-B0) to the gate of the driver device Q104. The de-select device Q106 can receive a latched value from another latch (such as 104-A1 or 104-B1) at its gate. The driver device Q104 can apply an activation voltage to a sub-array word line and the de-select device Q106 can apply a de-activation voltage to the sub-array word line. The transfer device Q102, driver device Q104, and de-select device can include insulated gate field effect transistors (IGFETs), and in the particular arrangement of FIG. 1a are n-channel IGFETs.

Having described the general constituents of one embodiment 100, the operation of the embodiment 100 will now be described in conjunction with a timing diagram set forth in FIG. 2. A number of waveforms are set forth in FIG. 2, including a "BXi" waveform that indicates when particular bank select signals are active. A "MWL, /MWL" waveform illustrates the response of a complementary main word line pair. A "RXmn" waveform sets forth the response of a word line supply signal. The value "m" can correspond to a particular bank, while the value "n" can correspond to the selection of one word line from a group of word lines. A "SWLmn" waveform sets forth the response of selected sub-array word lines. As in the case of the RXmn waveform, "m" can indicate a particular bank, while "n" can specify one word line from a group of word lines.

Figure 2:
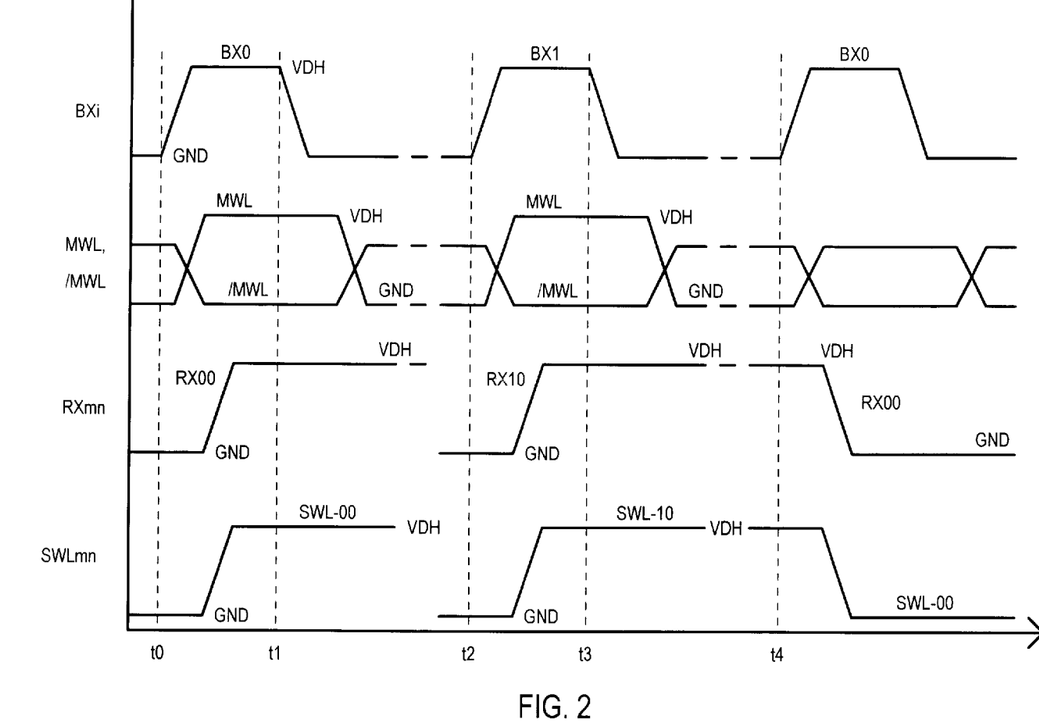
FIG. 2 is a timing diagram illustrating the operation of the embodiment set forth in FIG. 1.

Referring now to FIG. 2 in conjunction with FIG. 1, at time t0 a bank select signal BX0 transitions from a low voltage GND to a higher voltage VDH. The low to high transition will result in a main word line being coupled to latch storage devices. For example, in the event the dynamic latch of FIG. 1b is utilized, the high BX0 value will turn on transistors Q100 within latches 104-A0 and 104-A1. A transistor Q100 within latch 104-A0 will provide a low impedance path between main word line MWL and its storage device Q100. Similarly, a transistor Q100 within latch 104-A1 will provide a low impedance path between main word line /MWL and its storage device Q100. In the event the static latch of FIG. 1c is utilized, the high BX0 value will turn on gate T100 within latches 104-A0 and 104-A1. Gate T100 within latch 104-A0 will provide a low impedance path between main word line /MWL (because of its inverted output) and its storage device (cross-coupled inverters I100 and I102). Gate T100 within latch 104-A1 will provide a low impedance path between main word line MWL and its (cross-coupled inverters I100 and I102). In this way, an activated bank select signal can couple main word line values to latch storage elements.

Shortly after time t0, the main word line MWL is also driven to the VDH voltage while its complement /MWL is driven to the GND voltage. Because the BX0 signal remains high, the high MWL value is stored in latch 104-A0 and the low /MWL value is stored in latch 104-A1. The application of high and low main word line values to the latches 104-A0 and 104-A1, respectively, result in the selection of a group of sub-array word lines 106-00 to 106-03.

To select one of the four selected sub-array word lines SWL-00 to SWL-03, the RX00 signal is driven high, while the RX01 to RX03 signals are low. Consequently, the sub-array word line SWL-00 is driven to a select level (high in the particular example of FIGS. 1 and 2). In this way of row of memory cells in sub-array plate 102-A can be selected.

At time t1, the BX0 signal returns to the GND level. In the event the dynamic latch of FIG. 1b is used, transistor Q100 is turned off, isolating a storage device C100 from the MWL line (in the case of latch 104-A0) or from the /MWL line (in the case of latch 104-A1). In the event the static latch of FIG. 1b is used, transistor T100 is turned off, isolating a storage device (cross-coupled inverters I100 and I102) from the /MWL line (in the case of latch 104A0) or from the MWL line (in the case of latch 104-A1).

After time t1, the MWL signal can return low while the /MWL signal transitions to a high level VDD. The VDD level can be less than the VH level. However, because the previous active complementary main word line signals remain latched, by continuing to apply active RX00 signal, the sub-array word line SWL-00 continues to be selected, even though the complementary main word lines are in an inactive state.

At time t2, a different bank select signal BX1 transitions from the GND level to the VDH level. The high BX1 signal results in the MWL and /MWL levels being coupled to latches 104-B0 and 104-B1, respectively. If the latches (104-B0 and 104-B1) have the form of FIGS. 1b or 1c, they can operate as described in conjunction with latches 104-A0 and 104-A1 above. In this way, the same complementary main word line pair can select different banks by latching select values for the particular banks.

With the latching of active MWL and /MWL values in latches 104-B0 and 104-B1, a group of sub-array word lines (SWL-10 to SWL-13) are selected. To activate one of the four selected sub-array word lines (SWL-10 to SWL-13) the RX10 signal is driven high, while the RX11 to RX13 signals are low. Consequently, the sub-array word line SWL-10 is driven to a high level. In this way, a row of memory cells in sub-array plate 102-B can be selected by using the same complementary word line pair (MWL and /MWL) that is used to select a row of memory cells in another sub-array plate 102-A.

At time t3, the BX1 signal returns to the GND level. Latches (104-B0 and 104-B1) will operate as described above, isolating their respective latched values from the complementary word line pair (MWL and /MWL). Notably, the group of sub-array word lines (SWL-10 to SWL-13) will remain selected.

Following time t3, the MWL signal can return low while the /MWL signal transitions to a high level VDD. However, because the BX1 signal is low, by continuing to apply active RX10 signal, the sub-array word line SWL-10 can continue to be selected, even though the complementary main word lines are in an inactive state.

At time t4, a third access is made to the sub-array plate 102-A. The BX0 signal rises, essentially enabling input gates to latches 104-A0 and 104-A1. Thereafter the RX00 signal falls to the GND level, resulting in sub-array word line SWL-00 being deselected. This can allow another complementary main word line(s) to be selected, resulting in a group of sub-array word lines being selected. One of the sub-array word lines can then be activated by driving one of the RX00 to RX03 signals high, or the like.

In this way, a first embodiment is disclosed that can include a main word line (or complementary main word line pair) that can provide select values to multiple banks. One way to accomplish such an advantageous selecting capability is to include latches for selecting one or more sub-array word lines. Such latches can latch a main word line value for one bank. The main word line can be driven to an active level once again to select one or more sub-array word lines in a second bank.

A second embodiment will now be described in conjunction with a circuit diagram in FIG. 3 and a timing diagram in FIG. 4. The second embodiment can utilize capacitance inherent in word line driving nodes to form a dynamic latch. Such an approach can reduce the circuit area required for a latch.

Figure 3:
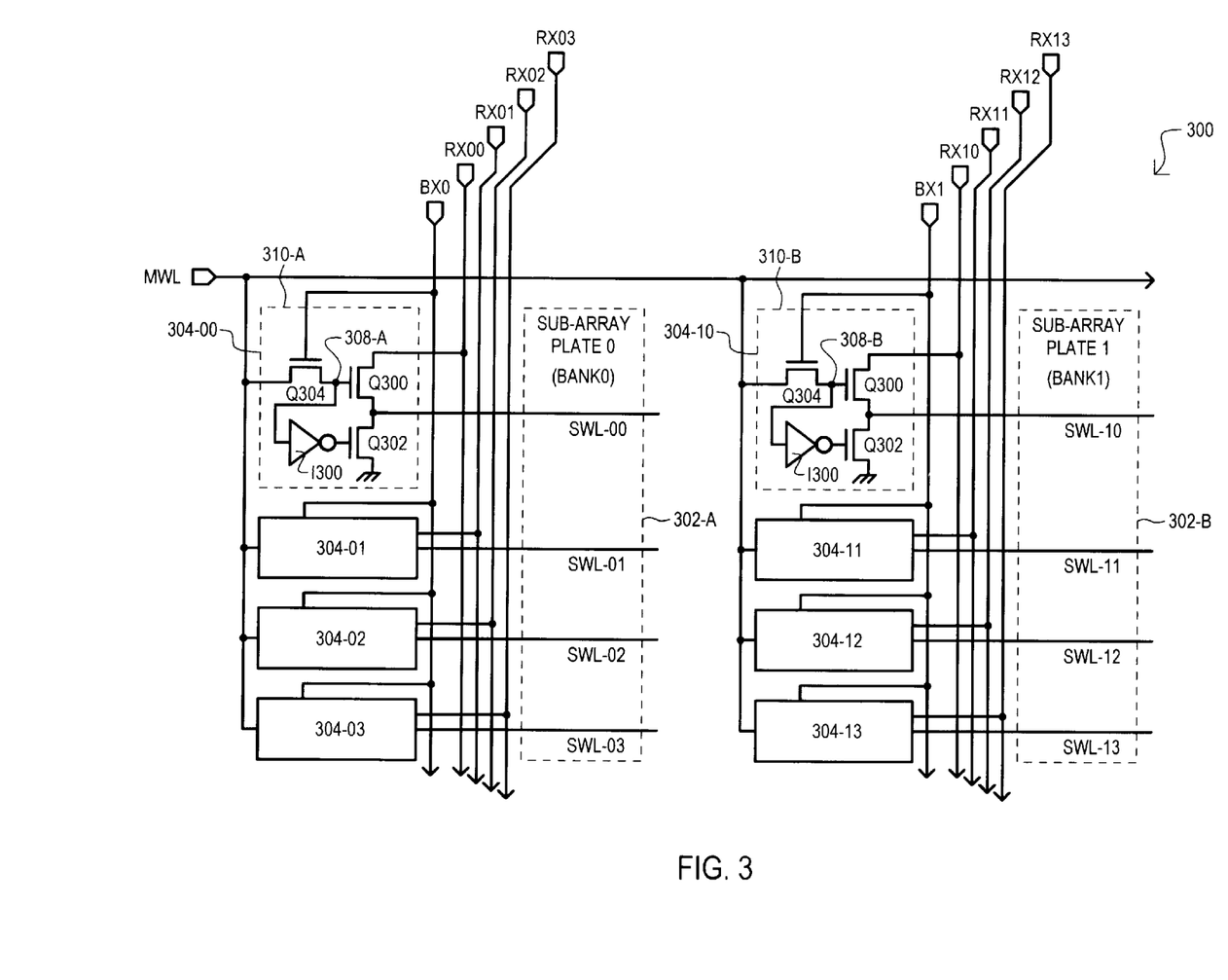
FIG. 3 is a circuit diagram showing a word line selection circuit according to another embodiment.

The second embodiment is a word line control circuit that is set forth in FIG. 3 and designated by the general reference character 300. The particular arrangement of FIG. 3 includes many of the same general constituents as the first embodiment. Included are two different sub-array plates 302-A and 302-B that can include a number of memory cells. The sub-array plates 302-A and 302-B can correspond to memory banks BANK0 and BANK1.

Memory of cells of a bank row can be accessed by activation of a sub-array word line. In FIG. 3, sub-array word lines SWL-00 to SWL-03 can access rows in BANK0, and sub-array word lines SWL-10 to SWL-13 can access rows in BANK1. Each sub-array word line (SWL-00 to SWL-13) is driven by a corresponding sub-array word line driver (304-00 to 304-13). Sub-array word line drivers 304-00 to 304-13 are each coupled to main word line MWL. One sub-array word line driver from the group 304-00 to 304-03 can be activated according to one of four driver signals RX00–RX03. In a similar fashion, one sub-array word line driver from the group 304-10 to 304-13 can be activated according to one of four other driver signals RX10–RX13.

One arrangement for a sub-array word line driver is illustrated by sub-array word line drivers 304-00 and 304-10. Sub-array word line drivers 304-00 and 304-10 are illustrated in detail in FIG. 3. In one particular arrangement, the sub-array word line drivers 304-00 and 304-10 can represent the basic structure of all sub-array word line drivers.

Sub-array word line drivers 304-00 and 304-10 are shown to include a driver device Q300, de-select device Q302, a transfer device Q304, and a driver inverter I300. The driver device Q300 can apply an activation voltage to a sub-array word line and the de-select device Q302 can apply a de-activation voltage to the sub-array word line. The driver and de-select devices (Q300 and Q302) can include insulated gate field effect transistors (IGFETs), and in the particular arrangement of FIG. 3 are n-channel IGFETs. The transfer device Q304 supplies a main word line signal to the select device Q300. In the arrangement of FIG. 3, the select device is an n-channel IGFET having a source-drain path disposed between a main word line MWL and the gate of device Q300. The gate of device Q304 receives a bank select signal. Driver inverter I300 inverts the MWL signal received at the gate of Q300, and applies it to the gate of de-select device Q302.

In the particular sub-array driver arrangement illustrated by sub-array driver 304-00 and 304-10, the gate of device Q300 forms part of a storage node 308. Each storage node 308, in combination with its corresponding transfer gate Q304, serves to latch a main word line value. Accordingly, sub-array word line drivers 304-00 to 304-10 can also serve as dynamic latches 310-A and 310-B.

In the second embodiment 300, a complementary main word line /MWL is not included. This particular approach can reduce the amount of wiring required in a semiconductor memory device.

Having described the general arrangement of a second embodiment, the operation of the second embodiment will now be described in conjunction with FIG. 4. FIG. 4 includes a "BXi" waveform setting forth the responses for the two bank select signals BX0 and BX1, a "MWL" waveform setting forth the response of a main word line, a "RXmn" waveform setting forth the response of selected supply signals RX00–RX13, and a "SWLmn" waveform setting forth the response of selected sub-array word lines (SWL-00 to SWL-13).

Figure 4:
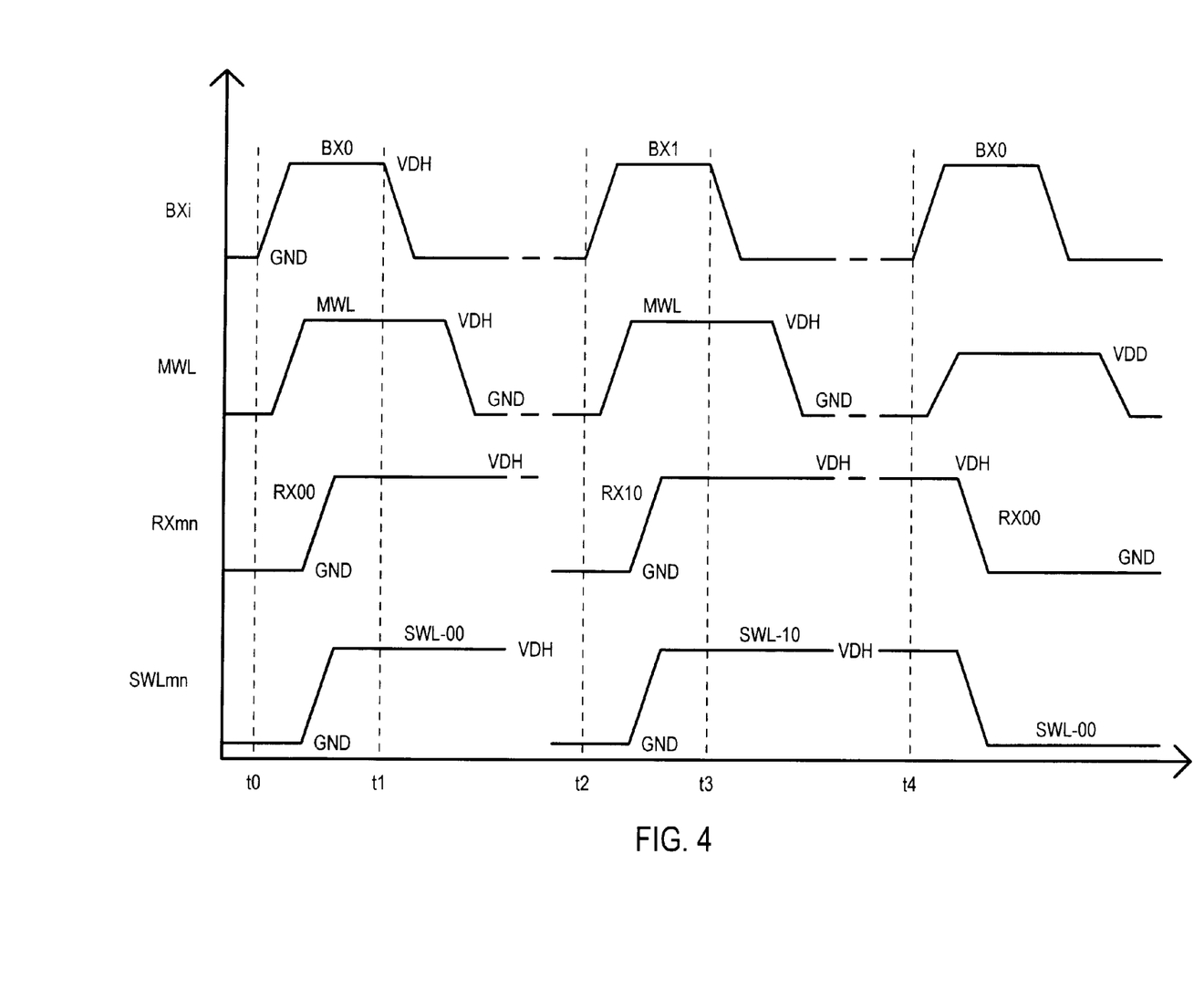
FIG. 4 is a timing diagram illustrating the operation of the embodiment set forth in FIG. 3.

Referring now to FIG. 4 in conjunction with FIG. 3, at time t0 a bank select signal BX0 transitions from a low voltage GND to a higher voltage VDH. The low to high transition will result in transfer devices Q304 of dynamic latch 310-A being turned on. As a result, a low impedance path will be formed between the MWL line and the storage node 308 within dynamic latch 310-A/sub-array word line driver 304-00. In this way, an activated bank select signal can couple a main word line value to a latch storage element (such as node 308-A or 308-B).

Shortly after time t0, the main word line MWL is also driven to the VDH voltage. Because the BX0 signal remains high, the high MWL value charges storage node 308-A of dynamic latch 310-A/driver 304-00. This results in the selection of a group of sub-array word lines SWL-00 to SWL-03.

To select one of the four selected sub-array word lines SWL-00 to SWL-03, the RX00 signal is driven high, while the RX01 to RX03 signals are low. Consequently, the sub-array word line SWL-00 is driven to a select level (high in the particular example of FIGS. 3 and 4). In this way of row of memory cells in sub-array plate 302-A can be selected.

At time t1, the BX0 signal returns to the GND level. Select device Q300 within dynamic latch 310-A/driver 304-00 is turned off, isolating the storage node 308-A from the MWL line. In this way, the activated sub-array word line SWL-00 can remain selected.

After time t1, the MWL signal can return low. However, because the storage node 308-A of dynamic latch 310-A/ driver 304-00 remains at the selected (high) level, sub-array word line SWL-00 continues to be selected, despite the fact that the main word line is in an inactive state.

At time t2, a different bank select signal BX1 transitions from the GND level to the VDH level. The high BX1 signal value results in the MWL line being coupled to storage node 308 in dynamic latch 310-B. In this way, a main word line value can be applied to a first bank (such as BANK0) and then applied to a second bank (such as BANK1).

A high value applied to storage node 308-B selects a group of sub-array word lines (SWL-10 to SWL-13) in a second bank (BANK1). To activate one of the four selected sub-array word lines (SWL-10 to SWL-13) the RX10 signal is driven high, while the RX11 to RX13 signals are low. Consequently, the sub-array word line SWL-10 is driven to a high level. In this way, a row of memory cells in sub-array plate 302-B can be selected by using the same main word line MWL that is used to select a row of memory cells in another sub-array plate 302-A.

At time t3, the BX1 signal returns to the GND level. The various transfer devices Q304 within the dynamic latch 310-B/driver 304-10 will turn off, isolating the stored MWL value the main word line MWL. The group of sub-array word lines (SWL-10 to SWL-13) will remain selected.

Following time t3, the MWL signal can return low. Because the BX1 signal is low, by continuing to apply active RX10 signal, the sub-array word line SWL-10 can continue to be activated, even though the main word line MWL is in an inactive state.

At time t4, a third access is made to the sub-array plate 302-A, but by the activation of a different main word line (not shown in FIG. 3). The BX0 signal rises again, enabling transfer devices within the various sub-array word line drivers coupled to the sub-array plate 302-A (including sub-array word line drivers 304-00 to 304-03). Thereafter the RX00 signal falls to the GND level, resulting in sub-array word line SWL-00 being deselected. The other main word line can then be driven, selecting a different group of sub-array word lines (not shown in FIG. 3). One of the sub-array word lines can then be activated by driving one of the RX00 to RX03 signals high, or the like.

In this way, a multi-bank memory device can utilize single main word lines (or single complementary word line pairs) to access multiple banks. Because approaches using only single main word lines can be employed, one row decoder can be used to access multiple banks.

The various embodiments set forth a word line control circuit that may be used in semiconductor devices having more than one bank. Because a dynamic and/or static latch is provided, a main line value can be stored. This allows sub-array word lines in different banks to be controlled individually. This is in contrast to the conventional example set forth in FIG. 6, in which sub-array word lines cannot be individually controlled. Thus, conventional approaches which do not benefit from the teachings set forth herein, may be forced to provide different main word lines for each different bank.

In contrast, in the various disclosed embodiments, because a single main word line can be used to access different sub-array word lines in different banks, a single row decoder can be used to access different locations in multiple banks. In the event a single row decoder is employed for multiple banks, savings in area can be achieved for a semiconductor memory device.

It is noted that while complementary main word lines are employed in the arrangement of FIG. 1a, a single main word line could be employed. In such a case, the /MWL value could be inverted prior to the latch (such as 104-A1 and 104-B1). Alternatively, the latch can be an inverting latch, such as that set forth in FIG. 1c.

While the various embodiments have been described with reference to a general RAM structure, the word line control circuit of the disclosed embodiments may be advantageously employed in a dynamic random access memory (DRAM). A DRAM manufacturing process may be capable of forming reliable capacitors for use in latch structures or the like. Further, because DRAM memory cells are very compact, the pitch advantages of utilizing a single main word line may be particularly beneficial.

A synchronous DRAM may also benefit from the teachings of the embodiment. The "pipelined" access utilized in many SDRAMs may be conducive to the described architecture, as relatively fast consecutive accesses to different banks can be accomplished.

However, while certain advantages can be achieved by utilizing the invention in DRAMs in general and SDRAMs in particular, the invention is not limited to such particular applications. Other devices having "main word lines" that are coupled to "sub-array word lines" can also benefit from the teachings set forth herein. As just a few examples, static RAMs (SRAMs), or non-volatile memory devices, such as read only memories (ROMs), including electrically programmable ROMs (EPROM), electrically erasable programmable ROMs (EEPROMs and "flash" EEPROMs), and ferroelectric RAMs (FRAMs) may be capable of benefiting from the claimed invention.

The present invention should not be construed as being limited only to memory devices either. Other integrated circuits having dense, repetitive logic cell structures accessed by a hierarchy of conductive lines can employ the latching approach described. For example, programmable circuits, such as programmable logic devices (PLDs) and programmable logic arrays (PLAs) often include numerous gates that can be accessed by more than one level of conductive lines, and so may benefit from the teachings set forth herein.

Accordingly, it is understood that while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A word line control circuit, comprising:
   a plurality of unit cells arranged into a first bank and a second bank;
   at least one first sub-word line coupled to the unit cells of the first bank;
   at least one second sub-word line coupled to the unit cells of the second bank;
   at least one main word line that provides a main word line value; and
   at least one first latch that can latch the main word line value and select at least one first sub-word line, the at least one first latch including a latch input coupled to a main word line by a controllable impedance path.

2. The word line control circuit of claim 1, further including:
   a bank select signal associated with each bank; and
   a first sub-word line can be selected by the activation of an associated bank select signal and the activation of the main word line.

3. The word line control circuit of claim 1, further including:
   a group of first sub-word lines;
   a group of sub-word line drivers for selecting first sub-word lines of the sub-word line group; and
   the at least one first latch provides an output that is commonly coupled to the group of sub-word line drivers.

4. The word line control circuit of claim 1, wherein:
   the at least one first latch includes a charge storage device and a switch device coupled to a first latch output.

5. The word line control circuit of claim 4, wherein:
   the charge storage device is a capacitor.

6. The word line control circuit of claim 4, wherein:
   the switch device is an insulated gate field effect transistor.

7. The word line control circuit of claim 1, wherein:
   the at least one first latch includes a switch device and cross-coupled inverters coupled to a first latch output.

8. The word line control circuit of claim 1, further including:
   at least one second latch that can latch the main word line value and select at least one second sub-word line.

9. A word line control system, comprising:
   a main word line;
   a first sub-array word line coupled to a first bank;
   a second sub-array word line coupled to a second bank;
   a first bank sub-word driver that activates the first sub-array word line, the first sub-word driver including a first bank insulated gate driver transistor, and a first bank dynamic latch that utilizes the gate capacitance of the first sub-word driver as a storage device; and a main word line value being latched in the first bank dynamic latch by the activation of a bank select signal corresponding to the first bank.

10. The word line control circuit of claim 9, wherein:

the first sub-word line can be selected by the activation of the bank select signal corresponding to the first bank and the activation of the main word line.

11. The word line control circuit of claim 9, wherein:

the first sub-word driver further includes a transfer device that provides a low impedance path between the main word line and the gate of the driver transistor when the bank select signal corresponding to the first bank is activated.

12. The word line control circuit of claim 9, further including:

a plurality of driver lines that can receive a drive potential;

a group of first sub-array word lines, each first sub-array word line of the group corresponding to at least one of the driver lines; and the group of first sub-array word lines can be selected by the activation of the bank select signal corresponding to the first bank and the activation of the main word line, one sub-array word line from the selected group of sub-array word lines being activated by its corresponding driver line receiving the drive potential.

13. The word line control circuit of claim 12, wherein:

each sub-array word line in the group of first sub-array word lines is driven by a corresponding sub-word driver; and the source-drain path of the driver transistor of each sub-word driver is coupled to at least one driver line.

14. The word line control system of claim 9, further including:

a second sub-word driver that activates the second sub-array word line, the second sub-word driver including
a second bank insulated gate driver transistor, and
a second bank dynamic latch that utilizes the gate capacitance of the second bank insulated gate driver transistor as a storage device; and the main word line value being latched in the second bank dynamic latch by the activation of a bank select signal corresponding to the second bank.

15. A semiconductor device, comprising:

a plurality of unit cells logically arranged into at least a first bank and a second bank;

a plurality of bank select signals including a first bank select signal corresponding to the first bank and a second bank select signal corresponding to the second bank;

first bank conductive lines coupled to selected unit cells of the first bank;

second bank conductive lines coupled to selected unit cells of the second bank;

at least one multi-bank conductive line that can have at least two values;

a first latch disposed between the multi-bank conductive line and the first bank conductive lines, the first latch latching the multi-bank conductive line values when the first bank select signal is active; and a second latch disposed between the multi-bank conductive line and the second bank conductive lines, the second latch latching the multi-bank conductive line values when the second bank select signal is active.

16. The semiconductor device of claim 15, wherein:

the first latch is a dynamic latch.

17. The semiconductor device of claim 15, wherein:

the first latch is a static latch.

18. The semiconductor device of claim 15, wherein:

the first bank conductive lines are driven to an active level by corresponding first bank driver insulated gate field effect transistors, the gates of the first bank driver insulated gate field effect transistors receiving latched multi-bank conductive line values at their respective gates; and the second bank conductive lines are driven to an active level by corresponding second bank driver insulated gate field effect transistors, the gates of the second bank driver insulated gate field effect transistors receiving latched multi-bank conductive line values at their respective gates.

19. The semiconductor device of claim 15, wherein:

the unit cells are dynamic random access memory cells.

20. The semiconductor device of claim 19, wherein:

the semiconductor device is a synchronous dynamic random access memory device;

the first bank conductive lines are first sub-array word lines;

the second bank conductive lines are second sub-array word lines; and the at least one multi-bank conductive line is a main word line.

* * * * *